(12) United States Patent
Shabra et al.

(10) Patent No.: US 7,693,923 B2
(45) Date of Patent: Apr. 6, 2010

(54) DIGITAL FILTER SYSTEM WHOSE STOPBAND ROOTS LIE ON UNIT CIRCLE OF COMPLEX PLANE AND ASSOCIATED METHOD

(75) Inventors: Ayman Shabra, Woburn, MA (US); Aiguo Yan, North Andover, MA (US)

(73) Assignee: Mediatek Inc., Hsin-Chu (TW)

( * ) Notice: Subject to any disclaimer, the term of this patent is extended or adjusted under 35 U.S.C. 154(b) by 1152 days.

(21) Appl. No.: 11/260,443

(22) Filed: Oct. 27, 2005

(65) Prior Publication Data

US 2006/0106906 A1     May 18, 2006

Related U.S. Application Data

(60) Provisional application No. 60/627,486, filed on Nov. 12, 2004.

(51) Int. Cl.
*G06F 17/10* (2006.01)

(52) U.S. Cl. .................... 708/300; 708/319

(58) Field of Classification Search .......... 708/300–323
See application file for complete search history.

(56) References Cited

U.S. PATENT DOCUMENTS

| | | | | |
|---|---|---|---|---|
| 4,536,886 | A * | 8/1985 | Papamichalis et al. | 704/207 |
| 5,566,167 | A * | 10/1996 | Duttweiler | 370/290 |
| 6,668,013 | B1 | 12/2003 | Okuno | |
| 2005/0193047 | A1 * | 9/2005 | Fu et al. | 708/300 |

* cited by examiner

*Primary Examiner*—Tan V Mai
(74) *Attorney, Agent, or Firm*—Winston Hsu (57) ABSTRACT

A method is disclosed for providing a digital filter system for providing a low pass filter function to a digital input. The method includes the steps of determining a finite impulse response of the input, determining a transfer function of the finite impulse response and providing a polynomial, identifying a plurality of stopband roots of the polynomial that lie in a complex plane, identifying real and complex conjugate pairs for the plurality of stopband roots, and providing coefficients for a complex polynomial that realizes the real and complex conjugate pairs such that a plurality of adjusted stopband roots lie on a unit circle of said complex plane.

20 Claims, 6 Drawing Sheets

DIGITAL FILTER SYSTEM WHOSE STOPBAND ROOTS LIE ON UNIT CIRCLE OF COMPLEX PLANE AND ASSOCIATED METHOD

PRIORITY

The application claims priority to U.S. Provisional Patent Application Ser. No. 60/627,486 filed Nov. 12, 2004.

BACKGROUND OF THE INVENTION

The invention generally relates to digital filters, and relates in particular to linear-phase finite impulse response (FIR) low pass filters for filtering digital data.

Digital filters may be used to reduce the amount of digital data to be transmitted, stored or processed in a digital signal processing system. In various applications, unfiltered data may be too voluminous to be transmitted, stored or processed, and in some applications, unfiltered data may even include unreliable or unwanted data that should be removed. The removal of certain of the digital data, however, presents the challenge that the desired information generally contained in the data should not be lost in the process.

Digital filters may remove or ignore data from a data input stream that is rapidly changing. For example, if input data may range from 100 to −100 at an input rate of x samples per second, then the fastest input changes would be a sequence of 100, −100, 100, −100 etc. for sequential bits. This may be considered a high frequency input stream and a digital filter may be used to remove the high frequency component of the input stream permitting less rapid changes in the data to pass through the filter.

For example, U.S. Pat. No. 6,668,013 discloses a digital filter that employs multipliers, but the use of a many multipliers in circuits typically adds considerable complexity and cost.

There continues to be a need, therefore, for an efficient and economical linear-phase FIR low pass filter for filtering digital data.

SUMMARY OF THE INVENTION

The invention provides a method for providing a digital filter system for providing a low pass filter function to a digital input. In accordance with an embodiment, the method includes the steps of determining a finite impulse response of the input, determining a transfer function of the finite impulse response and providing a polynomial, identifying a plurality of stopband roots of the polymonial that lie in a complex plane, identifying real and complex conjugate pairs for the plurality of stopband roots, and providing coefficients for a complex polynomial that realizes the real and complex conjugate pairs such that a plurality of adjusted stopband roots lie on a unit circle of said complex plane.

In accordance with another embodiment, the invention provides a method that includes the steps of determining a transfer function of a finite impulse response and providing a polynomial, identifying real and complex conjugate pairs for a plurality of stopband roots of the polymonial that lie in a complex plane, and providing coefficients for a complex polynomial that realizes the real and complex conjugate pairs such that a plurality of adjusted stopband roots lie on a unit circle of the complex plane. The coefficients are provided as circuits, each of which includes at least one register.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

The invention provides a system and method for an approximate implementation of linear-phase FIR low pass filters that may be formed in hardware implementations that are effective and efficient. The approach is applicable to linear-phase FIR filter transfer functions that are optimized through a broad range of techniques, including Parks-McLean and Remez algorithms as well as windowed designs. The approach is also applicable to the efficient realization of half-band filters and other filters that are broadly used for sample rate changing, interpolation and decimation.

Figure 1:
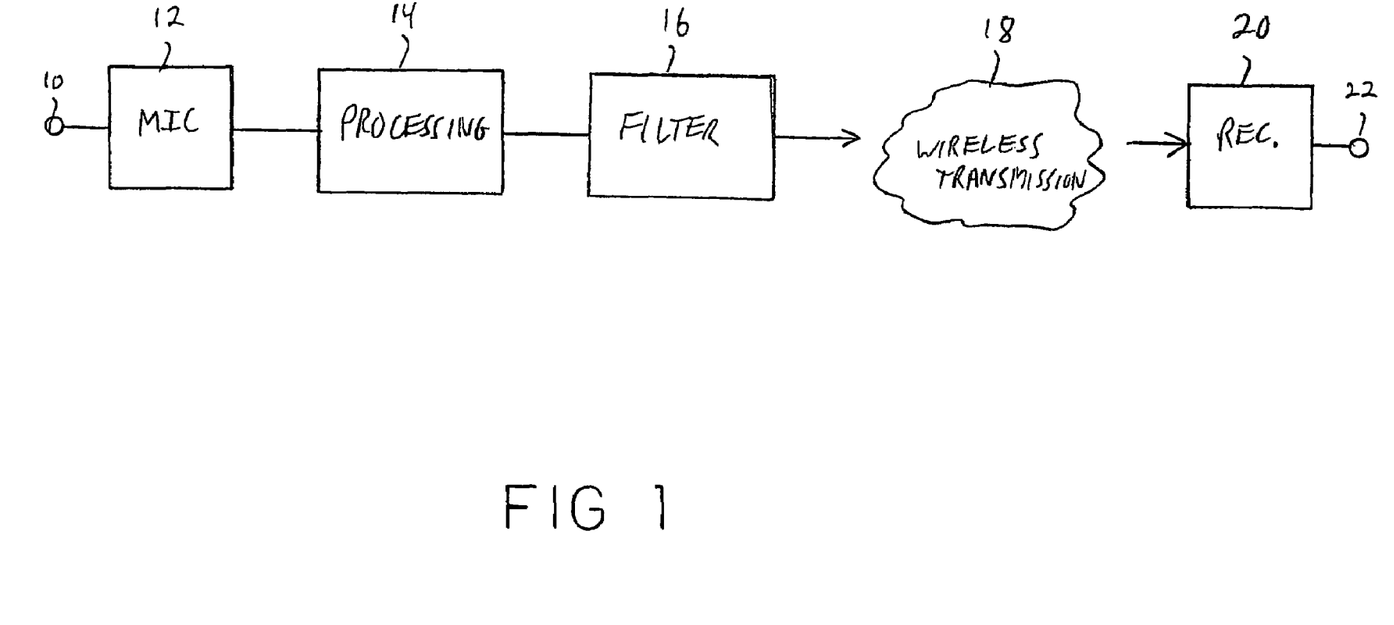
FIG. 1 shows an illustrative diagrammatic functional view of a digital data transmission system employing a digital filter system in accordance with an embodiment of the invention.

The filter may be used in a wireless telephone system as shown in FIG. 1 in which an input signal is received at a node 10 and provided to a microphone 12. The output of the microphone is provided to a processing unit 14 that produces a digital signal, and the digital signal is filtered by the filter 16. The filtered signal is then transmitted via a wireless communication path 18 to a receiver 20 where the received signal is provided at a receiver node 22.

Figure 2A:
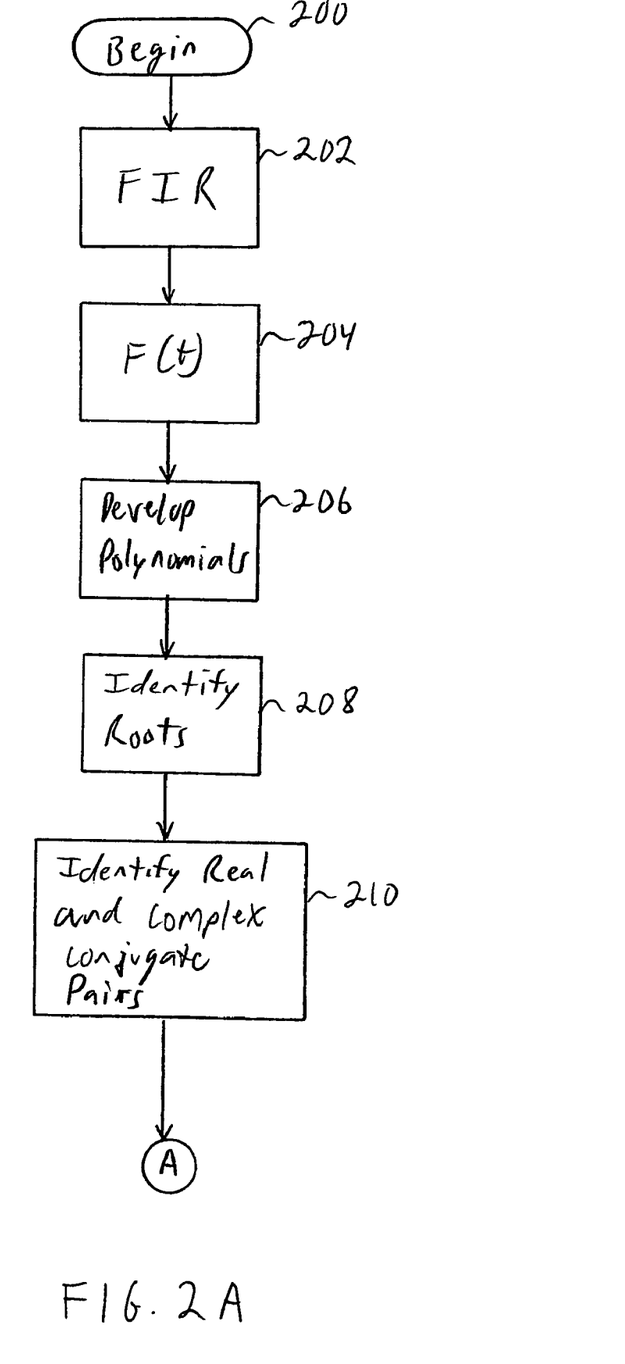
FIGS. 2A and 2B show an illustrative flow diagram of a method of the invention.
Figure 2B:
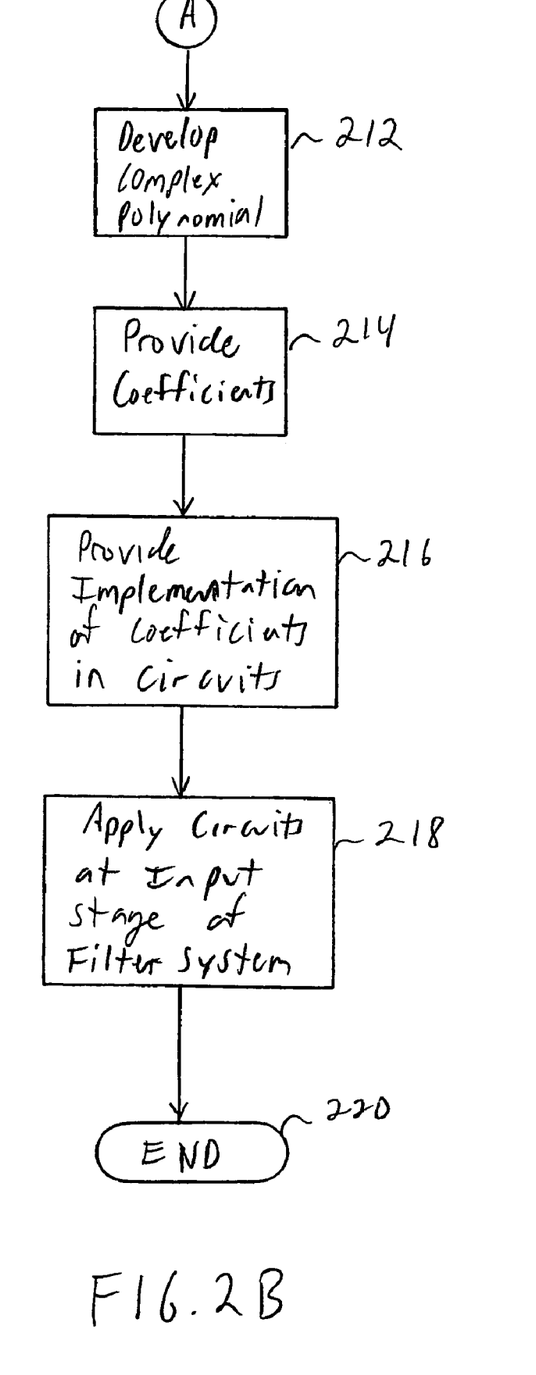

As shown in FIGS. 2A and 2B, a filtering method in accordance with an embodiment involves first factorizing the transfer function and then realizing these factors through straightforward hardware. The method begins (step 200) by determining a finite impulse response (step 202), and then performing a transformation on the response, e.g., a Z transform, (step 204). From the transformation, a polynomial is developed (step 206) and the zeros, or roots, of the polynomial are determined (step 208).

In particular, first assume that the filter impulse response is:

$$h(n) = \sum_{m=0}^{M} a_m \delta(m-n)$$

where δ(n) is the delta function and $a_m$ are the filter coefficients. For the linear-phase property it is necessary that the filter coefficients be symmetrical. The corresponding filter transfer function may be written as:

$$H(z) = \sum_{m=0}^{M} a_m z^{-m}$$

Figure 3:
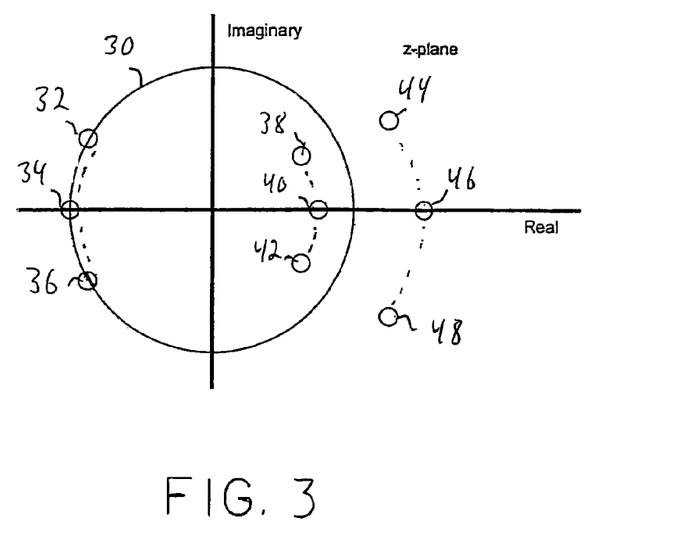
FIG. 3 shows an illustrative diagrammatic view of a representation in the complex plane of the zeros in a polynomial for an impulse response.

The real and complex conjugate pairs are determined (step 210) from the zeros of the transfer function, and the transfer function may be factorized as:

$$H(z) = \prod_{i=0}^{M-1} (z^{-1} - x_i)$$

where $x_i$ are the zeros of the transfer function and occur as real and complex conjugate pairs. For a linear-phase lowpass transfer function, the zeros are located in the z-plane as shown at 32, 34, 36, 38, 40, 42, 44, 46 and 48 in FIG. 3. The zeros 32, 34 and 36 are located on the unit circle 30 at z=−1 as complex conjugate pairs with angles ranging from −π to π clockwise on the unit circle. These zeros give the stop-band attenuation. Moreover, they are located as real and complex conjugate pairs near z=1 to give the passband shape. Furthermore, they have the symmetry property such that if $z_0$ is a zero then so is $z^*_0$, $z_0^{-1}$, and $(z_0^{-1})^*$.

The effectiveness of the filter at removing the high frequency components is a function of whether zero location errors may be avoided. With the roots having the above identified location in the complex plane, there is coefficient error in all realizations due to the finite resolution of number representations that result in errors in the location of the zeros, and where the errors increase as the coefficient resolution is decreased. In accordance with an embodiment of this invention, however, the error in the location of the zeros is minimized while simple coefficients are used. For stopband zeros the embodiment results in the movement of the zeros along the unit circle 30 in the complex plane. This maintains the performance of the system, which is to reduce the high frequency components.

Once the locations of the zeros have been determined in the z-plane, zero pairs are selected. Stopband zeros are paired into real and complex conjugate pairs. The complex polynomial is developed (step 212), and coefficients are determined as follows (step 214). The real poles can be exactly realized using:

$$H_{stopband,1}(z) = z^{-1} + 1$$

The complex conjugate pairs may be realized approximately using:

$$H_{stopband,j}(z) = z^{-2} + \left(2 - \frac{1}{k}\right)z^{-1} + 1$$

Where k is a power of 2. The coefficients are then selected (step 214) such that the value of k is selected to give a zero location as close as possible to the ideal zero location. Since k is a power of 2, this factor of the transfer function may be realized using only 3 adders. Since the method does not move the zeros off the unit circle, it provides near ideal stop band rejection. This is unlike alternate implementations that result in the zeros that are not on the unit circle due to finite coefficient resolution.

The real passband zeros occur in pairs as b and 1/b. These zeros may be realized with:

$$H_{passband,l}(z) = -z^{-2} + \left(b + \frac{1}{b}\right)z^{-1} - 1$$

The term (b+1/b) may generally be approximated as a ratio of small integers resulting in a simple hardware implementation (step 216) utilizing a few number of adders.

Figure 4:
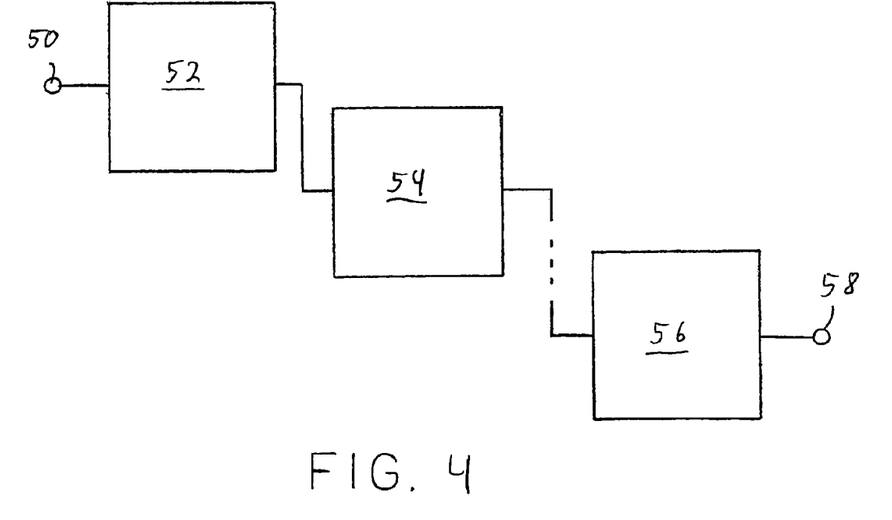
FIG. 4 shows an illustrative diagrammatic view of a digital filter system in accordance with an embodiment of the invention.

In accordance with various embodiments, the system provides that a plurality of specialized circuits 52, 54 and 56 may be cascaded together between an input node 50 and an output node 58 as shown in FIG. 4, and applied to a filter circuit (step 218). The method then ends (step 220).

Figure 5:
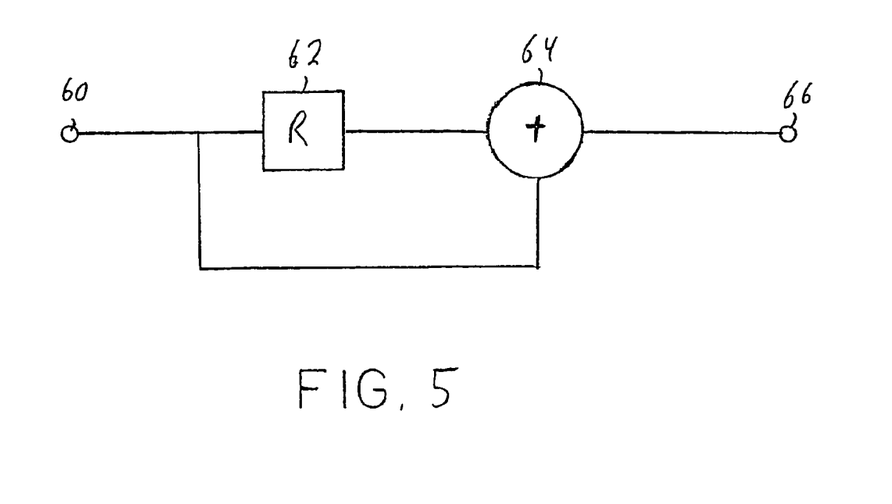
FIG. 5 shows an illustrative diagrammatic schematic view of a portion of the digital filter system shown in FIG. 4.

One such circuit 52 is shown in FIG. 5 wherein the input node 60 corresponds to the input node 50 of FIG. 4. The circuit includes a register 62 and adder 64. The input data stream is received at the input node 60, and the register 62 delays the data in its path by one sample. It loads the data at every clock edge and adds the delayed version of the data using the adder 64. The output is provided at node 66. For example, if the input string is 0, 1, 2, 1. Then the output at node 66 would be 0, 1, 2, 1 plus 0, 0, 1, 2, 1=0, 1, 3, 3, 1. The two inputs are un-weighted. The output at node 66 may then be coupled to an input 70 of the circuit shown in FIG. 6.

Figure 6:
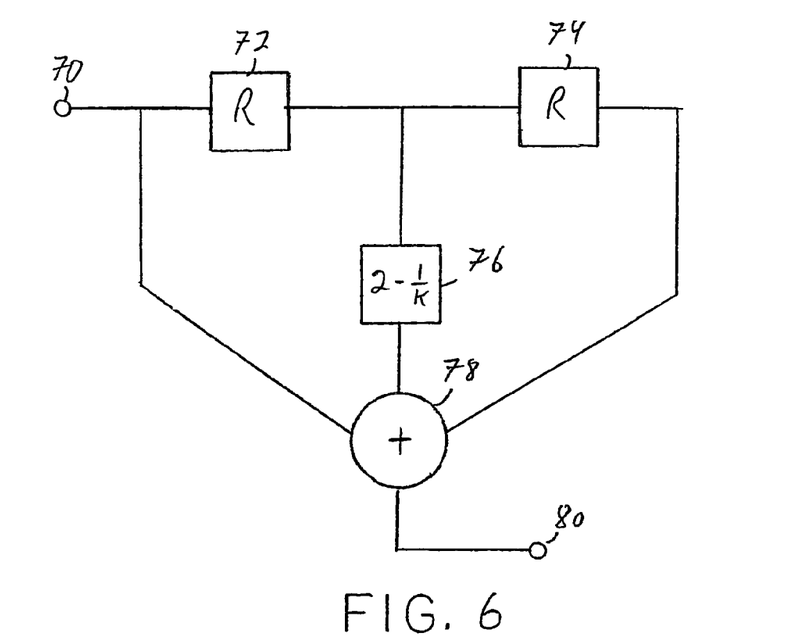
FIG. 6 shows an illustrative diagrammatic schematic view of another portion of the digital filter system shown in FIG. 4.

In the circuit of FIG. 6, three data paths are provided to an adder 78, one of which is direct, one of which includes registers 72 and coefficient 76, and one of which includes registers 72 and 74. If k is a power of 2, then implementing the system in hardware is straightforward since binary multiplication or division of a binary number may be achieved by moving the decimal place.

Lastly, the passband complex conjugate zeros may be approximated by starting from a polar representation of the zero $z_0 = ce^{j\theta}$, which results in a transfer function factor as:

$$H_{passband,l}(z) = [c^2 z^{-2} - (2c\cos\theta)z^{-1} + 1] \times \left[\begin{array}{c} \frac{1}{c^2}z^{-2} - \\ \left(\frac{2}{c}\cos\theta\right)z^{-1} \end{array} + 1\right]$$

This formulation is conducive to approximation although not effectively as the previous approximations, making this methodology most effective for lower order FIR filters with fewer complex conjugate zeros.

Figure 7:
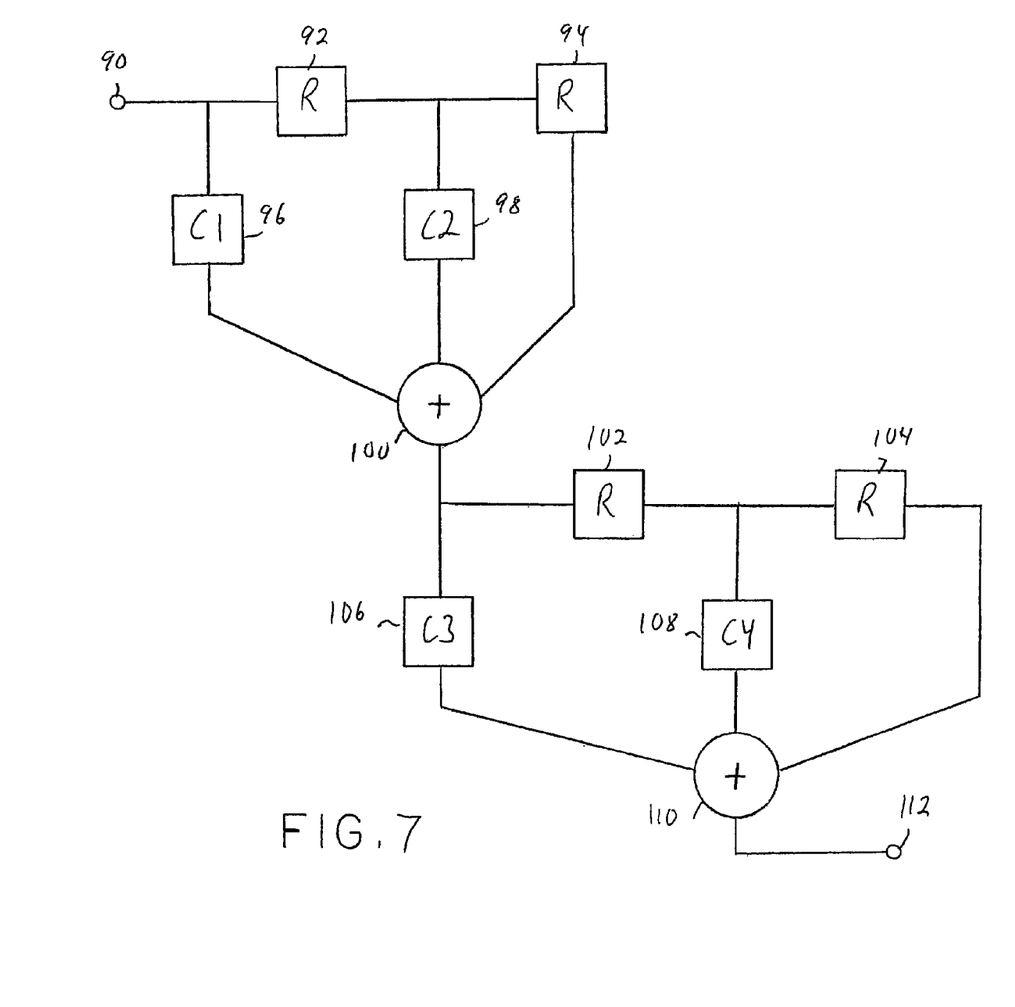
FIG. 7 shows an illustrative diagrammatic schematic view of a further portion of the digital filter system shown in FIG. 4.

This may be accomplished in a circuit as shown in FIG. 7 wherein the input node 90 corresponds to the output node 80 of the circuit of FIG. 6. The circuit itself includes two cascaded networks. The first includes a summation unit 100 that combines data from three input paths, one of which includes coefficient 96, one of which includes registers 92 and coefficient 98, and the third of which includes registers 92 and 94. The second network includes a combiner 110 that receives input from three paths from the output of the combiner 100, one of which further includes coefficient 106, one of which further includes registers 102 and coefficient 108, and the third of which further includes registers 102 and 104.

Those skilled in the art will appreciate that numerous modifications and variations may be made to the above disclosed embodiments without departing from the spirit and scope of the invention.

What is claimed is:

1. A method providing a digital filter system for providing a low pass filter function to a digital input, said method comprising the steps of:
    determining a finite impulse response of a filter;
    determining a transfer function of the finite impulse response and providing a polynomial;
    identifying a plurality of stopband roots of said polynomial that lie in a complex plane;
    identifying real and complex conjugate pairs for said plurality of stopband roots;
    providing coefficients for a complex polynomial that realizes the real and complex conjugate pairs such that a plurality of adjusted stopband roots lie on a unit circle of said complex plane; and
    configuring the digital filter system by the coefficients.

2. The method as claimed in claim 1, wherein said method further includes the step of approximating real stopband roots at z=1 using:

$$H_{stopband,i}(z) = z^{-1} + 1.$$

3. The method as claimed in claim 1, wherein said method further includes the step of approximating complex conjugate stopband roots using:

$$H_{stopband,j}(z) = z^{-2} + \left(2 - \frac{1}{k}\right)z^{-1} + 1$$

where k is a power of 2.

4. The method as claimed in claim 1, wherein said method further includes the step of approximating real passband roots using:

$$H_{stopband,l}(z) = -z^{-2} + \left(b + \frac{1}{b}\right)z^{-1} - 1$$

and where the term (b+1/b) is replace by a ratio of small integers.

5. The method as claimed in claim 1, wherein said method further includes the step of approximating complex conjugate passband roots, where one of these zeros is $z_0 = ce^{j\theta}$, using:

$$H_{stopband,l}(z) = [c^2 z^{-2} - (2c\cos\theta)z^{-1} + 1] \times \left[\frac{1}{c^2}z^{-2} - \left(\frac{2}{c}\cos\theta\right)z^{-1} + 1\right]$$

where $c^2$, $2c\cos\theta$, $1/c^2$ and $2/c\cos\theta$ are replaced with small integers.

6. The method as claimed in claim 1, wherein said method further includes the step of providing a circuit that includes a register for providing said coefficients.

7. The method as claimed in claim 6, wherein said method further includes the step of providing additional circuits that include further registers.

8. The method as claimed in claim 1, wherein the configuration step further comprises configuring the digital filter system using a single register and an adder, where an input of the single register and an output of the single register are summed up by the adder to produce an output.

9. The method as claimed in claim 1, wherein the configuration step further comprises configuring the digital filter system using an adder and a cascade of two registers including a first register and a second register, where the adder sums up an output of the first register gained by (2−/k), an input of the first register, and an output of the second register to produce an output.

10. The method as claimed in claim 1, wherein the configuration step further comprises configuring the digital filter system using an adder and a cascade of two registers including a first register and a second register, where the adder subtracts an input of the first register and an output of the second register from an output of the first register amplified by a gain equal to a ratio of two small integers.

11. The method as claimed in claim 1, wherein the configuration step further comprises configuring the digital filter system using two cascaded networks including a first network and a second network, where the first network comprises a first summation unit combining data from three input paths, and the second network comprises a second summation unit combining data from three paths output from the first summation unit.

12. The method as claimed in claim 11, wherein a first path of the first network comprises a first coefficient, a second path of the first network comprises a first register and the second coefficient, a third path of the first network comprises a second register, a first path of the second network comprises an output of the first summation unit and a third coefficient, a second path of the second network comprises the output of the first summation unit, a third register and a fourth coefficient, and a third path of the second network comprises the output of the first summation unit, the third register and a fourth register.

13. A method providing a digital filter system for providing a low pass filter function to a digital input, said method comprising the steps of:
    determining a transfer function of a finite impulse response and providing a polynomial;
    identifying real and complex conjugate pairs for a plurality of stopband roots of said polynomial that lie in a complex plane;
    providing one or more coefficients for a complex polynomial that realizes the real and complex conjugate pairs such that a plurality of adjusted stopband roots lie on a unit circle of said complex plane, said coefficients being provided as circuits, each of which includes at least one register; and
    configuring the digital filter system by the coefficients.

14. The method as claimed in claim 13, wherein said circuits include at least one circuit that provides the function (2−1/k) where k is a provided coefficient.

15. The method as claimed in claim 13, wherein said circuits include at least one circuit that provides the function (b+1/b) where b is a non-zero value.

16. The method as claimed in claim 13, wherein said circuits are coupled to one another in a cascaded form.

17. A digital filter system that provides a low pass filter function to a digital input, said system comprising:
    a plurality of registers connected in series, wherein a leading register of the plurality of registers is utilized for receiving the digital input, and each of which provides a coefficient value for a complex polynomial that realizes real and complex conjugate pairs such that a plurality of adjusted stopband roots lie on a unit circle of a complex plane for real and complex conjugate pairs associated with a transfer function of a finite impulse response of the filter system; and an adder, coupled to the plurality of registers, for summing up at least outputs of the registers to generate a filtered digital signal.

18. The system as claimed in claim 17, wherein said registers include at least one circuit that provides the function $(2-1/k)$ where k is a provided coefficient.

19. The system as claimed in claim 17, wherein said registers include at least one circuit that provides the function $(b+1/b)$ where b is a non-zero value.

20. The system as claimed in claim 17, wherein said registers are coupled to one another in a cascaded form.

* * * * *